(12) United States Patent
Abdoli et al.

(10) Patent No.: US 9,614,499 B2
(45) Date of Patent: Apr. 4, 2017

(54) SYSTEM AND METHOD FOR FILTER DESIGN AND USAGE THEREOF

(71) Applicant: Huawei Technologies Co., Ltd., Shenzhen (CN)

(72) Inventors: Javad Abdoli, Kanata (CA); Ming Jia, Ottawa (CA); Jianglei Ma, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 433 days.

(21) Appl. No.: 14/222,280

(22) Filed: Mar. 21, 2014

(65) Prior Publication Data
US 2015/0270827 A1   Sep. 24, 2015

(51) Int. Cl.
*H03H 17/02*   (2006.01)
*H03H 17/00*   (2006.01)

(52) U.S. Cl.
CPC . *H03H 17/0248* (2013.01); *H03H 2017/0072* (2013.01)

(58) Field of Classification Search
None
See application file for complete search history.

(56) References Cited

U.S. PATENT DOCUMENTS

| 2002/0136288 A1* | 9/2002 | McCarty, Jr. | ...... H03H 17/0219 375/232 |
| 2008/0256160 A1* | 10/2008 | Lusk | ................. H03H 17/0216 708/405 |

FOREIGN PATENT DOCUMENTS

| CN | 101645862 A | 2/2010 |
| CN | 101645863 A | 2/2010 |
| CN | 102111368 A | 6/2011 |
| EP | 1835682 A2 | 9/2007 |

OTHER PUBLICATIONS

International Search Report and Written Opinion of Patent Cooperation Treaty (PCT), Application No. PCT/CN2015/073876, Applicant: Huawei Technologies Co., Ltd., date of mailing Jun. 10, 2015, 11 pages.
Faulkner, M., "The Effect of Filtering on the Performance of OFDM Systems," IEEE Transactions on Vehicular Technology, vol. 49, No. 5, Sep. 2000, pp. 1877-1884.
Xiao, P., et al., "Transmit and Recieve Filter Design for OFDM Based WLAN Systems," Wireless Communications and Signal Processing (WCSP), 2010 International Conference, Oct. 21-23, 2010, 4 pages.
Smith, "The Scientist and Engineer's Guide to Digital Signal Processing—Windowed-Sinc Filters," Scientist and Engineers Guide to Digitial Signal Processing, Jan. 1, 1999, 12 pages.

(Continued)

*Primary Examiner* — Michael D Yaary
(74) *Attorney, Agent, or Firm* — Slater Matsil, LLP

(57) ABSTRACT

A method of designing a truncated filter includes designing a prototype filter with a target frequency response, and selecting a soft truncation function with a roll-off parameter specifying a rate in which the soft truncation function transitions to zero. The method also includes applying the soft truncation function to the prototype filter to produce a truncated filter, and storing the truncated filter to a memory.

22 Claims, 10 Drawing Sheets

(56) References Cited

OTHER PUBLICATIONS

Wylie-Green, et al., "Power and Spectrally Efficient Multiple Access Using CPM over SC-FDMA," 2010 IEEE Vehicular Technology Conference, May 16-19, 2010, 6 pages.

Zhang, et al., "Filtered-OFDM-Enabler for Flexible Waveform in the 5th Generation Cellular Networks," 2015 IEEE Global Communication Conference, IEEE, Dec. 6, 2015, 6 pages.

* cited by examiner

SYSTEM AND METHOD FOR FILTER DESIGN AND USAGE THEREOF

TECHNICAL FIELD

The present disclosure relates generally to digital communications, and more particularly to a system and method for filter design and usage thereof.

BACKGROUND

Orthogonal frequency division multiplexing (OFDM) has been adopted as the main transmission waveform of many advanced wireless communications systems, including the Third Generation Partnership Project (3GPP) Long Term Evolution (LTE). OFDM offers many benefits including: efficient implementation using Fast Fourier Transforms (FFT), robustness against multipath fading channel when used in conjunction with a cyclic prefix (CP), and the like.

A drawback of OFDM is that it has high spectral side lobes, which makes it spectrally inefficient due to the necessity of a frequency guard band. As an example, in 3GPP LTE, the frequency guard bands account for approximately 10% of the available bandwidth. Therefore, a significant fraction of the available bandwidth is not being used to improve communications system performance.

SUMMARY OF THE DISCLOSURE

Example embodiments of the present disclosure which provide a system and method for filter design and usage thereof.

In accordance with an example embodiment of the present disclosure, a method for designing a truncated filter is provided. The method includes designing, by a designing device, a prototype filter with a target frequency response, and selecting, by the designing device, a soft truncation function with a roll-off parameter specifying a rate in which the soft truncation function transitions to zero. The method also includes applying, by the designing device, the soft truncation function to the prototype filter to produce a truncated filter, and storing, by the designing device, the truncated filter to a memory.

In accordance with another example embodiment of the present disclosure, a method for transmitting data is provided. The method includes designing, by a transmitting device, a first filter truncated by a first soft truncation function with a first roll-off parameter specifying a first rate in which the first soft truncation function transitions to zero, and filtering, by the transmitting device, a first data signal with the first filter. The method also includes transmitting, by the transmitting device, the filtered first data signal.

In accordance with another example embodiment of the present disclosure, a designing device is provided. The designing device includes a processor, and a memory operatively coupled to the processor. The processor designs a prototype filter with a target frequency response, selects a soft truncation function with a roll-off parameter specifying a rate in which the soft truncation function transitions to zero, applies the soft truncation function to the prototype filter to produce a truncated filter, and stores the truncated filter to a memory. The memory stores the truncated filter.

In accordance with another example embodiment of the present disclosure, a transmitting device is provided. The transmitting device includes a processor, and a transmitter operatively coupled to the processor. The processor designs a first filter truncated by a first soft truncation function with a first roll-off parameter specifying a first rate in which the first soft truncation function transitions to zero, and filters a first data signal with the first filter. The transmitter transmits the filtered first data signal.

One advantage of an embodiment is that the use of soft truncation with designer specifiable roll-off parameter enables the design of finite length filters with sharp transitions and relatively flat pass bands. Such filters allow for a reduction in guard band size while not significantly adding to distortion. The designer of the filter is able to trade-off transition sharpness, filter length, pass band flatness, distortion, and the like.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION OF ILLUSTRATIVE EMBODIMENTS

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the disclosure and ways to operate the disclosure, and do not limit the scope of the disclosure.

One embodiment of the disclosure relates to filter design and usage thereof. For example, a designing device designs a prototype filter with a target frequency response, selects a soft truncation function with a roll-off factor specifying a rate in which the soft truncation function transitions to zero, applies the soft truncation function to the prototype filter to produce a truncated filter, and stores the truncated filter to a memory.

The present disclosure will be described with respect to example embodiments in a specific context, namely communications systems that use OFDM as a transmission waveform. The disclosure may be applied to standards compliant communications systems, such as those that are compliant with Third Generation Partnership Project (3GPP), IEEE 802.11, and the like, technical standards, and non-standards compliant communications systems, that use OFDM as a transmission waveform. However, the disclosure may also be applied to situations wherein there is a need for a finite length filter with sharp transitions and relatively smooth pass band.

Figure 1:
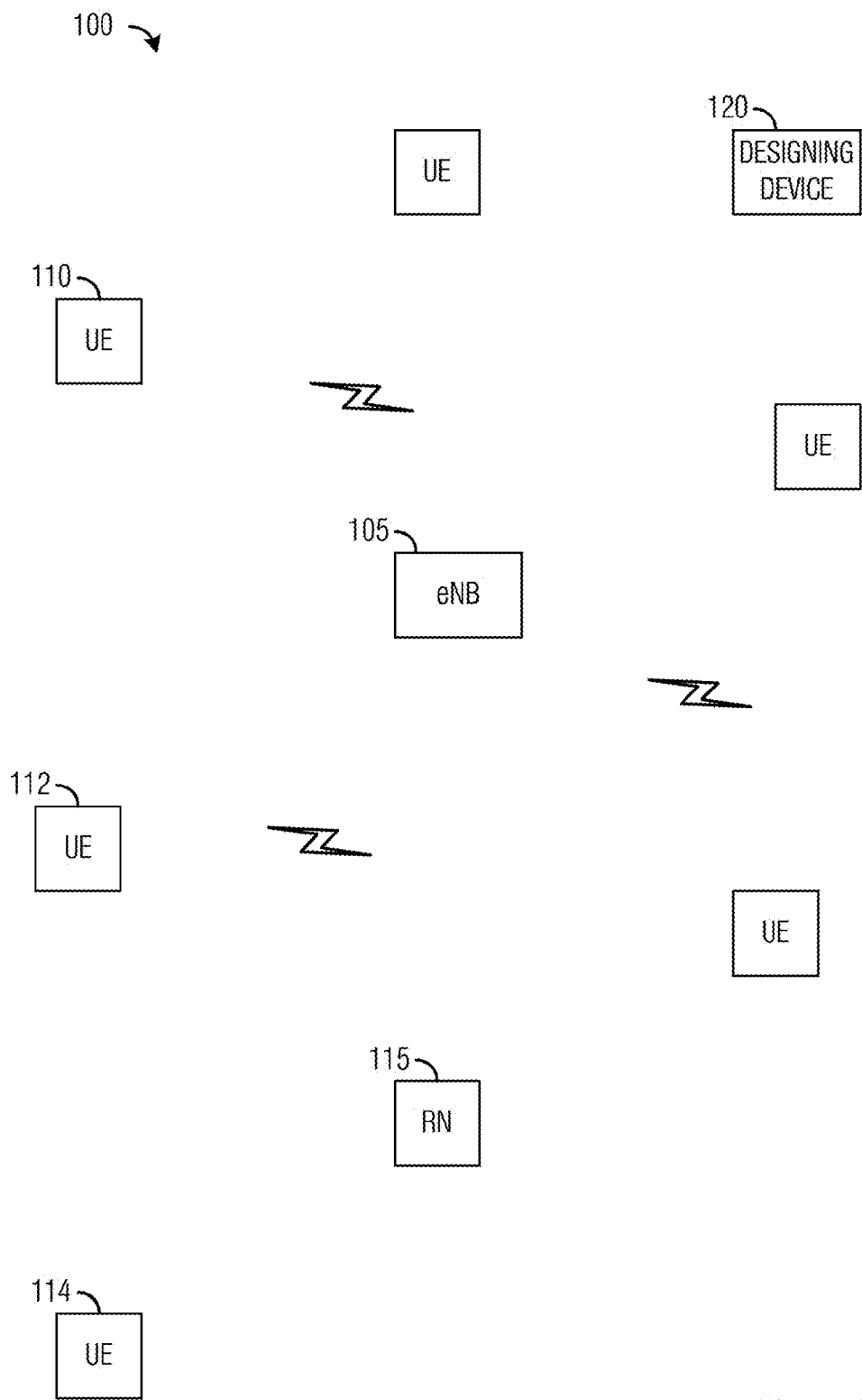
FIG. 1 illustrates an example communications system according to example embodiments described herein.

FIG. 1 illustrates an example communications system 100. Communications system 100 includes an eNB 105 serving a plurality of UEs, such as UE 110, UE 112, and UE 114. In general, communications to and from a UE pass through eNB 105. However, in a machine-to-machine (M2M) mode, UEs may be able to communicate directly without going through eNB 105. Communications system 100 may also include a relay node (RN) 115. RN 115 may use network resources of eNB 105 to help improve coverage and overall performance. As shown in FIG. 1, RN 115 may serve UE 114 to help improve coverage for UE 114. Furthermore, eNB 105 and RN 115 may simultaneously transmit to UE 114 to further improve overall performance.

It is noted that an eNB may also be commonly referred to as a base station, NodeB, controller, communications controller, and the like. Similarly, a UE may also be commonly referred to as a mobile station, mobile, user, subscriber, terminal, and the like.

While it is understood that communications systems may employ multiple eNBs capable of communicating with a number of RNs and UEs, only one eNB, and a number of RNs and UEs are illustrated for simplicity.

Communications system 100 may also include a designing device 120. Designing device 120 may be used to design filters for use in communications system 100. Designing device 120 may be a stand-alone device that designs filters and saves them to memory, such as a local database or a remote database, or provides the filters to an operator of communications device 120, which may provide the filters to devices operating in communications system 100. Designing device 120 may also be co-located with an entity in communications system 100, such as an eNB or any other network side entity. Designing device 120 may also be co-located in a subset of devices operating in communications system 100. For devices with co-located designing devices, these devices may design their own filters. For devices without co-located designing devices, these devices may use filters designed by another device.

In communications systems that support OFDM, OFDM signals in two different carriers may be transmitted in adjacent frequency bands that are separated by guard bands. In general, it is preferable to have narrow guard bands as opposed to wide guard bands since a portion of the frequency allocated to the wide guard bands may be used to transmit OFDM subcarriers and improve communications system efficiency.

Figure 2:
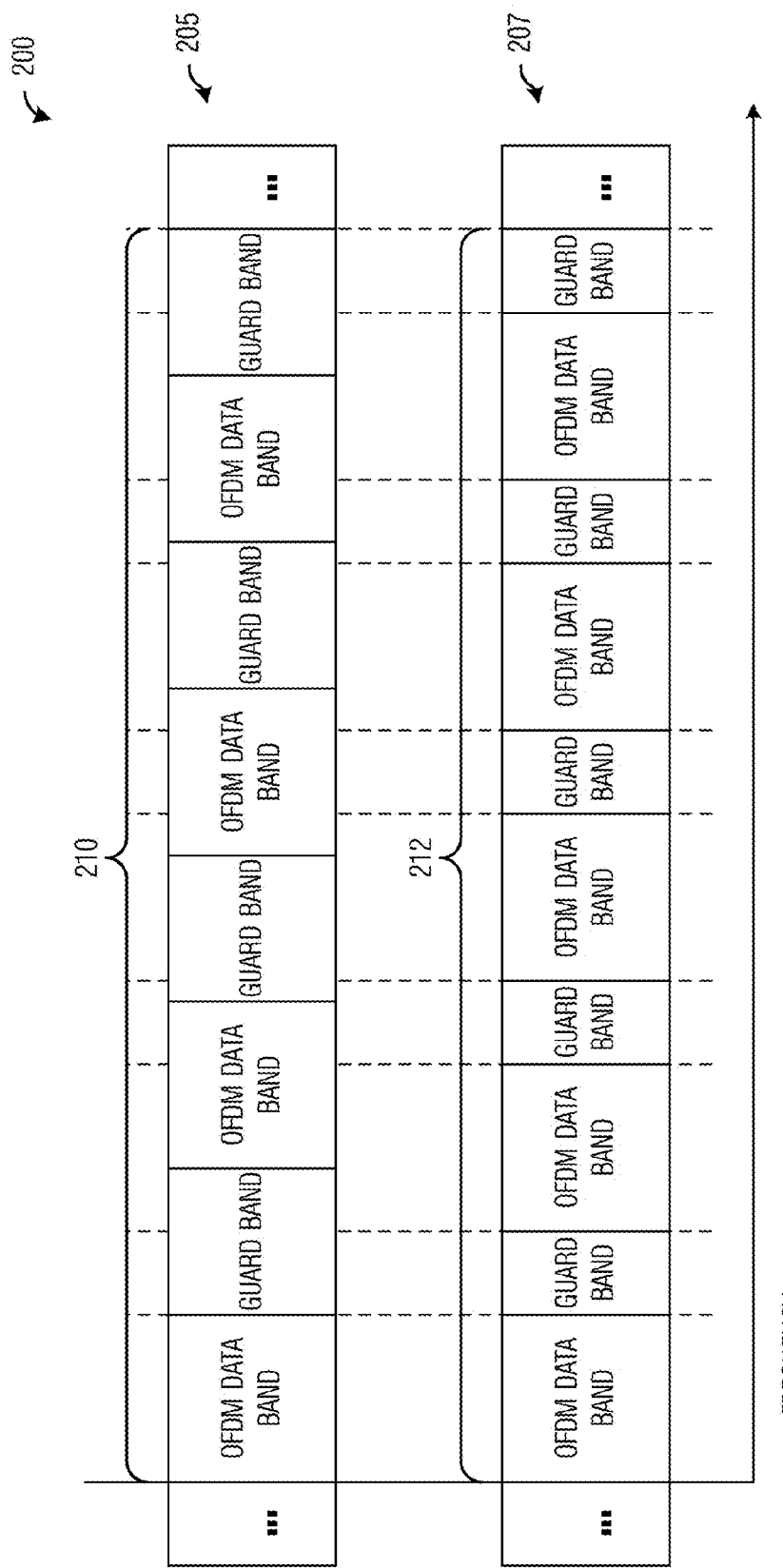
FIG. 2 illustrates an example frequency bands according to example embodiments described herein.

FIG. 2 illustrates example frequency bands 200. A first band (shown as blocks) 205 may be representative of a frequency band with wide guard bands and a second band 207 may representative of a frequency band with narrow guard bands. As shown in FIG. 2, over a substantially equal frequency range, communications system(s) utilizing first band 205 may be able to transmit 4 OFDM data bands while communications system(s) utilizing second band 207 may be able to transmit 5 OFDM data bands, with the OFDM data bands of the frequency bands occupying about the same bandwidth. The difference in the two arising from the narrower guard bands of the second band 207. Therefore, the communications system(s) utilizing second band 207 are able to utilize a larger percentage of the available bandwidth to transmit data.

Figure 3A:
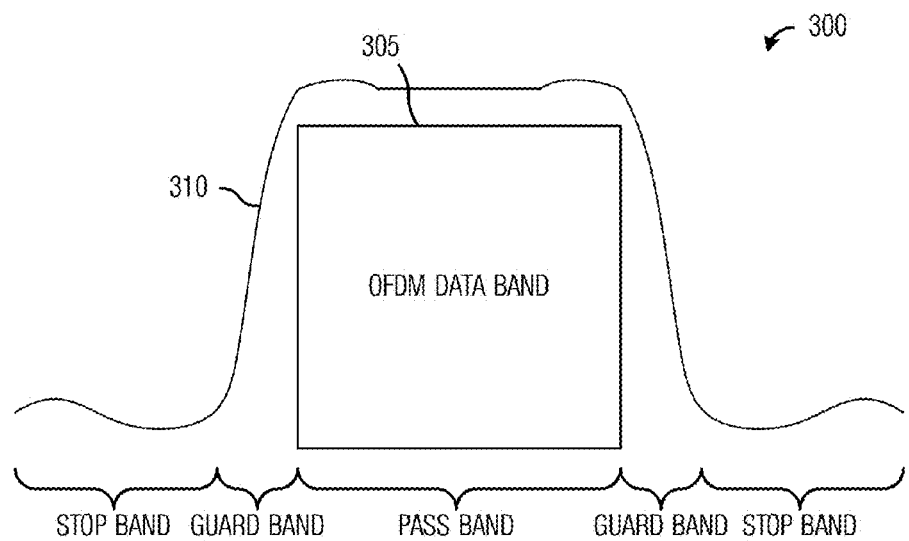
FIG. 3a illustrates a frequency domain view of an example OFDM data band and filter response where the filter has a slow transition according to example embodiments described herein.

FIG. 3a illustrates a frequency domain view 300 of an example OFDM data band 305 and filter response 310 where the filter has a slow transition. OFDM data band 305 fits within the pass band of the filter, therefore the filter may not significantly impact OFDM data band 305. However, ripple present in the pass band of the filter may distort OFDM data band 305, therefore, ripple should be minimized. The transition between the pass band and the stop band of the filter occurs within the guard band.

Figure 3B:
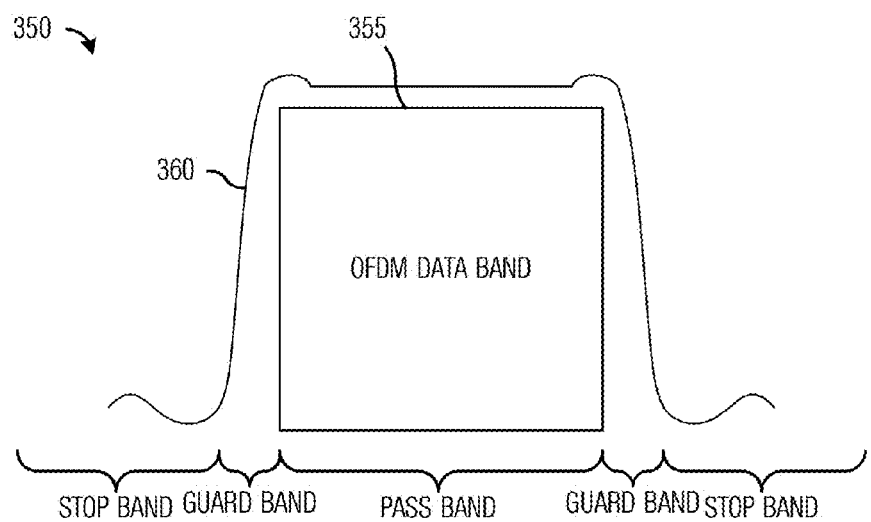
FIG. 3b illustrates a frequency domain view of an example OFDM data band and filter response where the filter has a fast transition according to example embodiments described herein.

FIG. 3b illustrates a frequency domain view 350 of an example OFDM data band 355 and filter response 360 where the filter has a fast transition. The transition between the pass band and the stop band of the filter occurs within the guard band, as is for the filter with filter response 310 shown in FIG. 3a. However, the transition is faster and may allow for a narrower guard band. As shown in FIGS. 3a and 3b, the guard band shown in FIG. 3b is approximately 75% of the size of the guard band shown in FIG. 3a. The additional 25% may be used to transmit data in the form of additional OFDM subcarriers. It is noted that the illustrations shown in FIGS. 3a and 3b are for discussion purposes and may be exaggerated to illustrate some features.

A potential filter that may be used is a sinc filter. Sinc filters have frequency responses that look like squares and/or rectangles, with substantially flat pass bands and transitions that are instantaneous. Although the sinc filters have the best possible frequency response in terms of reducing guard band size, the sinc filters are infinite length filters that effectively makes them non-ideal candidates in actual communications systems since the filtering will never be completed (due to the infinite length filter). Therefore, there is a desire to design finite length filters with frequency responses that closely match the frequency response of the sinc filter. It is noted that although the discussion focuses on the sinc filter, the example embodiments presented herein may be applied to the design of any filter with any frequency response.

According to an example embodiment, it may be possible to truncate a prototype filter having a specified frequency response with a soft truncation function that gradually transitions to zero to produce a truncated filter. Truncating the prototype filter, such as a sinc filter that has an ideal flat pass band and infinitely short transition, shortens the length of the prototype filter and makes the resulting truncated filter a viable candidate for use in actual communications systems. How rapidly a soft truncation function transitions to zero may be characterized by a roll-off parameter, such as a roll-off factor $\beta$, which may range from 0.0 to 1.0. Although the discussion focuses on a roll-off parameter that ranges from 0.0 to 1.0, other roll-off parameter ranges are also possible. A soft truncation function with a roll-off parameter close to 0.0 may transition to 0 very quickly, and if the roll-off parameter is equal to 0.0, the soft truncation function may be equal to a hard truncation function with instantaneous transitions to 0. A soft truncation function with a roll-off parameter close to 1.0 may transition to 0 very slowly. Truncation in general may be analogous to applying a windowing mask to the prototype filter.

Figure 4:
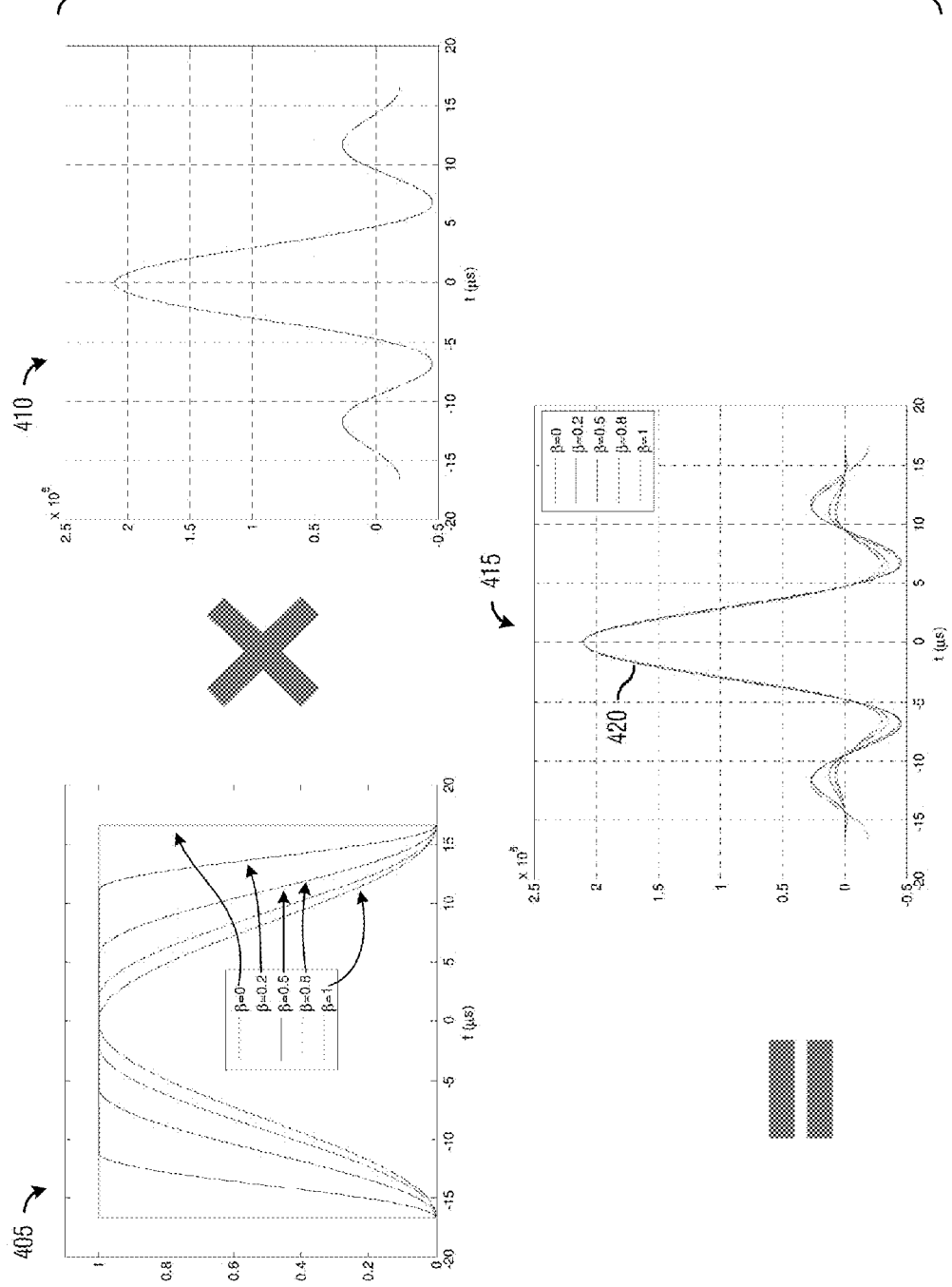
FIG. 4 illustrates data plots of impulse responses of example soft truncation functions, an example prototype filter, and example truncated filters according to example embodiments described herein.

FIG. 4 illustrates data plots of impulse responses of example soft truncation functions, an example prototype filter, and example truncated filters. Data plot 405 displays example soft truncation functions with a range of roll-off parameters, ranging from 0.0 to 1.0. As shown in FIG. 4, with a roll-off parameter of 0.0, the soft truncation function has a shape that matches that of a hard truncation function. As the roll-off parameter increases to 1.0, the shapes of soft truncation functions show that the transition to 0 becomes more gradual. Data plot 410 displays the impulse response of an example prototype filter that has been abbreviated to approximately 33.33 micro seconds.

According to an example embodiment, truncating the prototype filter with the soft truncation functions is performed by multiplying the prototype filter with the soft truncation functions. Data plot 415 displays impulse responses of example truncated filters corresponding to the prototype filter after being soft truncated (with the application of the soft truncation functions shown in data plot 405). The impulse responses show that the truncated filters look very similar to the prototype filter, especially in main lobe 420.

Figure 5A:
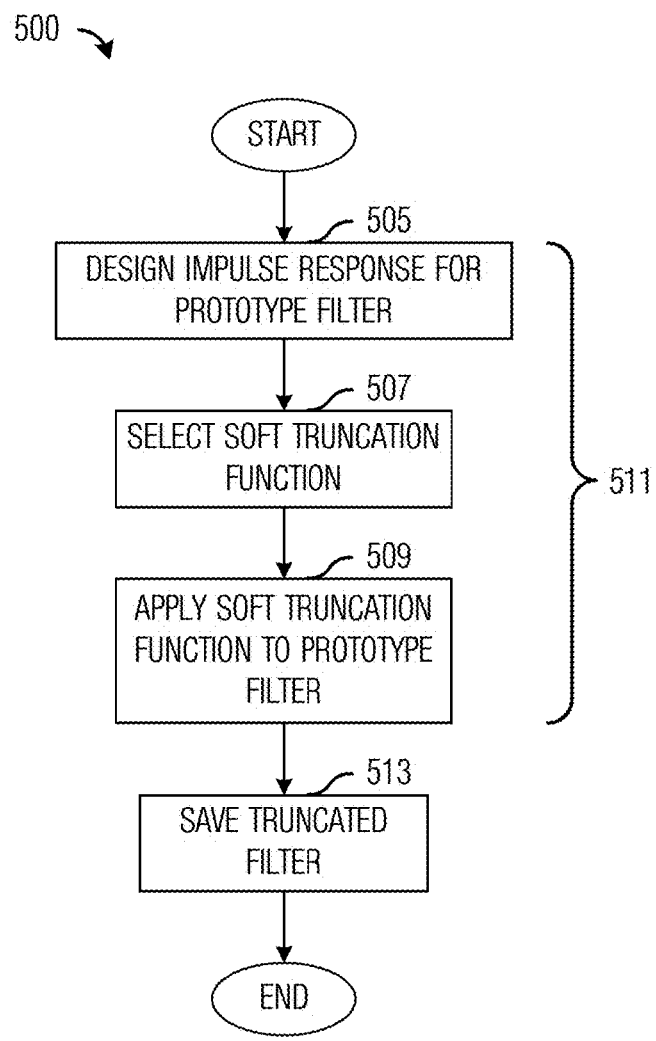
FIG. 5a illustrates a flow diagram of example operations occurring in a designing device as the designing device designs a truncated filter according to example embodiments described herein.

FIG. 5a illustrates a flow diagram of example operations 500 occurring in a designing device as the designing device designs a truncated filter. Operations 500 may be indicative of operations occurring in a designing device, such as a stand-alone or co-located designing device, as the designing device designs a truncated filter.

Operations 500 may begin with the designing device designing an impulse response for a prototype filter (block 505). The designing device may design the impulse response so that it matches or exceeds spectral requirements, to filter an OFDM signal or OFDM data band, for example. As an illustrative example, the designing device may design the prototype filter so that it has a pass band duration of sufficient duration to not impart undue distortion on the OFDM signal, as well as a sufficiently rapid transition to that the transmission of the filtered OFDM signal does not cause too much interference, and the like. In other words, the designing device may design the impulse response of the prototype filter so that it meets spectral requirements. The designing device may design the prototype filter so that it has the impulse response of a sinc filter, for example. It is noted that the prototype filter may also be designed in the frequency domain. The sinc filter may be a good candidate as prototype filter since it has no distortion in the pass band and total out of band rejection (i.e., instantaneous transition).

The designing device may select a soft truncation function (block 507). As discussed previously, the sinc filter is an infinite length filter, which makes it impractical. The designing device may perform soft truncation on the prototype filter to make it a finite length filter without incurring significant filtering performance penalties of hard truncation, which includes significant ripples in the pass band that lead to distortion, and slow transitions that lead to interference. According to an example embodiment, selecting a soft truncation may include selecting a function to perform the soft truncation, as well as selecting the roll-off parameter, such as roll-off factor $\beta$, that indicates the rate in which the function transitions to 0. As an example, a raised cosine may be selected to perform the soft truncation. The raised cosine may be expressed as $$f_w(t) = \begin{cases} 1, & |t| \leq \frac{1-\beta}{2f_0} \\ \frac{1}{2}\left[1 + \cos\left(\frac{\pi f_0}{\beta}\left[|t| - \frac{1-\beta}{2f_0}\right]\right)\right], & \frac{1-\beta}{2f_0} < |t| \leq \frac{1+\beta}{2f_0}, \\ 0, & O.W. \end{cases}$$

where $f_0 \triangleq (1+\beta)/T_w$, $T_w$ is the time duration of the soft truncation function. It is noted that the raised cosine is an example of a soft truncation function and other functions with gradual transitions to 0 may be used in its place. Examples of other soft truncation functions may include ramp functions, curve functions, elliptical functions, exponential functions, blackman windows, Kaiser windows, Chebyshev windows, and the like.

As discussed previously, the roll-off parameter may range from 0.0 to 1.0 (it is noted that other ranges for the roll-off parameter may also be possible). As the roll-off parameter approaches 0.0, the transition to 0 becomes faster and a corresponding soft truncation function behaves like a hard truncation function. As the roll-off parameter approaches 1.0, the transition to 0 becomes slower and a corresponding soft truncation function behaves less like a hard truncation function. In general, the selection of the roll-off parameter may involve evaluating a trade-off between pass band distortion (roll-off parameter closer to 0.0) versus transition sharpness (roll-off parameter closer to 1.0) of the resulting truncated filter.

The designing device may apply the soft truncation function to the prototype filter to produce the truncated filter (block 509). The application of the soft truncation function to the prototype filter may be expressed as $$h(t) = h_p(t) \cdot f_w(t),$$

where $h(t)$ is impulse response of the truncated filter, $h_p(t)$ is the impulse response of the prototype filter, and $f_w(t)$ is the soft truncation function. As an example, if the prototype filter is designed to have the impulse response of a sinc function, the impulse response of the prototype filter may be expressed as $$h_p(t) = W\text{Sinc}(Wt).$$

The application of the soft truncation function to the prototype filter in the time domain may be achieved by multiplying the two, while a convolution is used if the application is performed in the frequency domain.

Collectively, the designing of the impulse response of the prototype filter, the selecting of the soft truncation function, and the applying of the soft truncation function to the prototype filter to produce the truncated filter may be referred to as designing the truncated filter (blocks 511).

The designing device may save the truncated filter (block 513). The designing device may save coefficients corresponding to the truncated filter. The designing device may save the truncated filter to a local memory or database. The designing device may save the truncated filter to a remotely located memory or database. The designing device may save the truncated filter by providing it to an entity in the communications system.

Figure 5B:
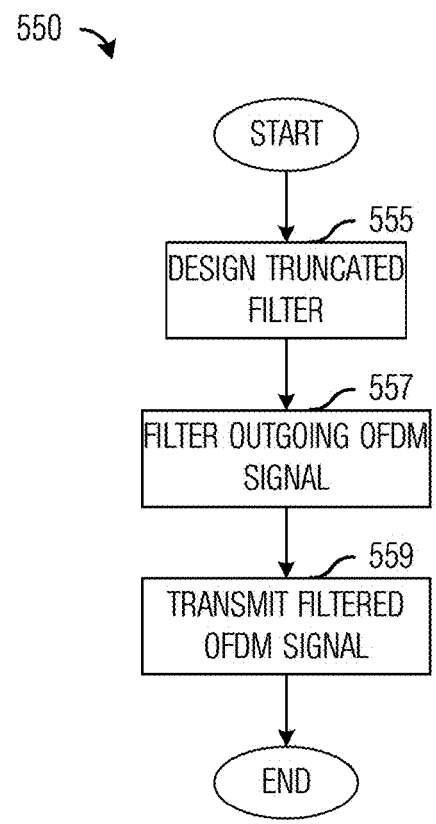
FIG. 5b illustrates a flow diagram of example operations occurring in a transmitting device as the transmitting device transmits using a truncated filter according to example embodiments described herein.

FIG. 5b illustrates a flow diagram of example operations 550 occurring in a transmitting device as the transmitting device transmits using a truncated filter. Operations 550 may be indicative of operations occurring in a transmitting device, such as an eNB or a UE with a co-located designing device, as the transmitting device transmits using a truncated filter.

Operations 550 may begin with the transmitting device designing a truncated filter (block 555). According to an example embodiment, the transmitting device may utilize a filter design algorithm, such as one described in FIG. 5a, to design the truncated filter. According to an alternative example embodiment, the transmitting device may retrieve the truncated filter, e.g., the coefficients of the truncated filter, from a local memory or database, a remote memory or database, an entity in the communications system, and the like.

The transmitting device may use the truncated filter to filter an OFDM signal (block 557). The transmitting device may filter the OFDM signal using the truncated filter. It is noted that if the transmitting device is transmitting multiple OFDM signals simultaneously on multiple frequency bands, the transmitting device may need to use multiple truncated filters to filter the OFDM signals individually. The transmitting device may transmit the filtered OFDM signal (block 559).

Figure 6:
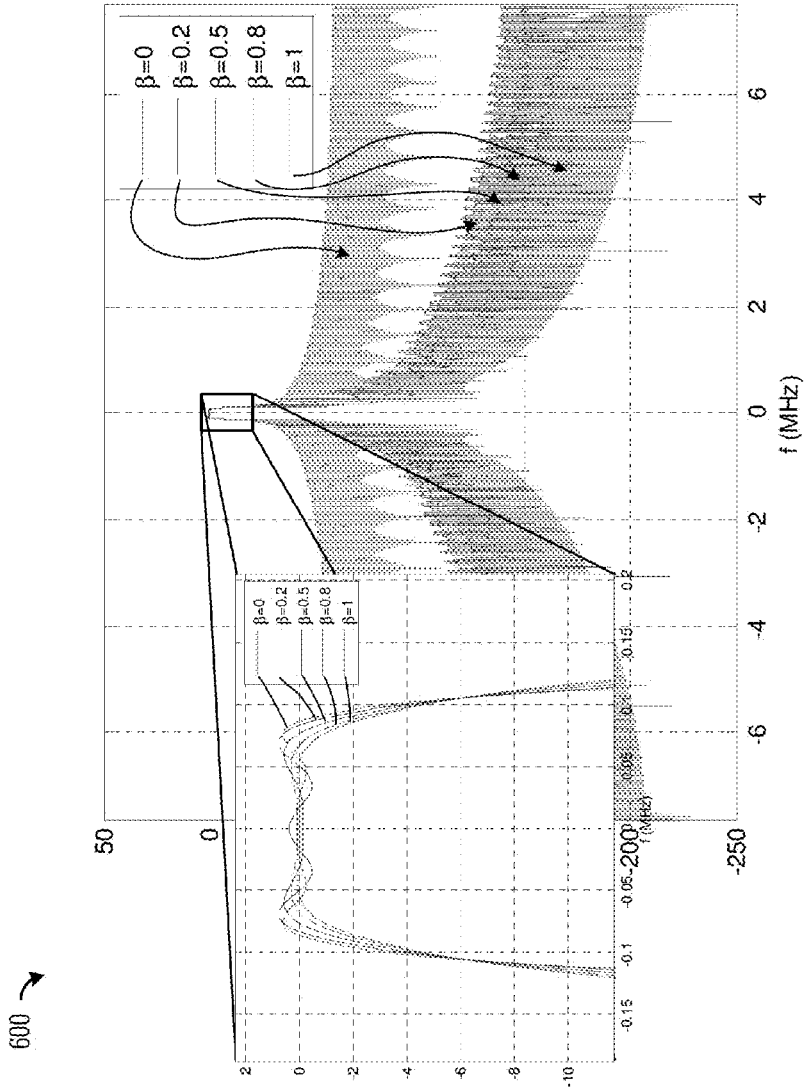
FIG. 6 illustrates a data plot of example frequency responses for truncated filters that have been truncated by soft truncation functions with different roll-off factors according to example embodiments described herein.

FIG. 6 illustrates a data plot 600 of example frequency responses for truncated filters that have been truncated by soft truncation functions with different roll-off parameters. The truncated filters correspond to a prototype filter with a sinc filter impulse response soft truncated with raised cosine soft truncation functions with roll-off parameters of 0.0, 0.2, 0.5, 0.8, and 1.0, respectively. Data plot 600 shows that as the roll-off parameter increases (i.e., the soft truncation functions having slower transitions to 0), the transitions become slower and the distortion in the pass bands becomes greater while stop band rejection becomes greater.

Figure 7A:
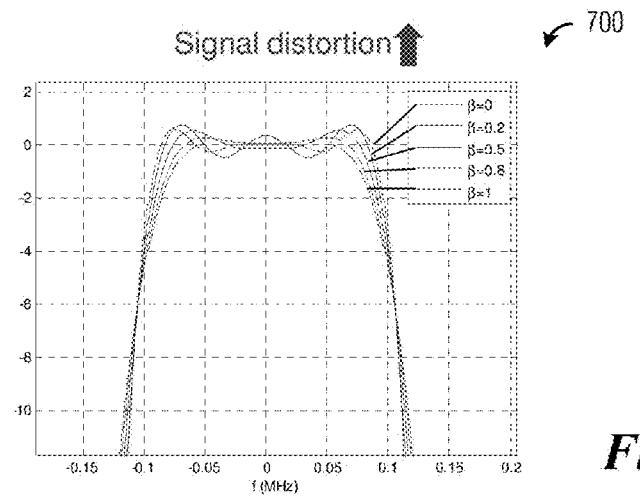
FIGS. 7a through 7c illustrate data plots of example frequency responses for truncated filters that have been truncated by soft truncation functions with different roll-off factors, highlighting distortion, transition duration, and stop band rejection according to example embodiments described herein.
Figure 7B:
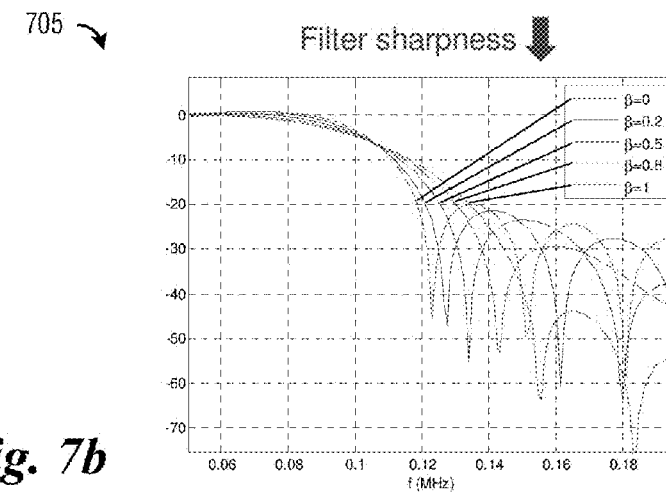
Figure 7C:
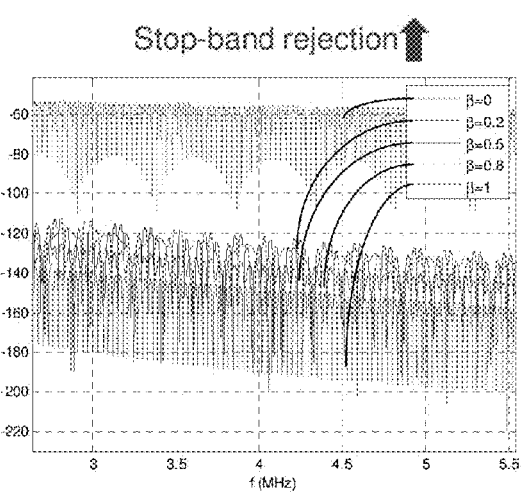

FIGS. 7a through 7c illustrate data plots 700, 705, and 710 of example frequency responses for truncated filters that have been truncated by soft truncation functions with different roll-off parameters, highlighting distortion, transition duration, and stop band rejection. The truncated filters correspond to a prototype filter with a sinc filter impulse response soft truncated with raised cosine soft truncation functions with roll-off parameters of 0.0, 0.2, 0.5, 0.8, and 1.0, respectively. Data plot 700 shows that as the roll-off parameter increases, distortion increases due to greater ripple in the pass band. Data plot 705 shows that as the roll-off parameter increases, transition duration increases and filter sharpness decreases. Data plot 710 shows that as the roll-off parameter increases, the stop band rejection increases.

Figure 8A:
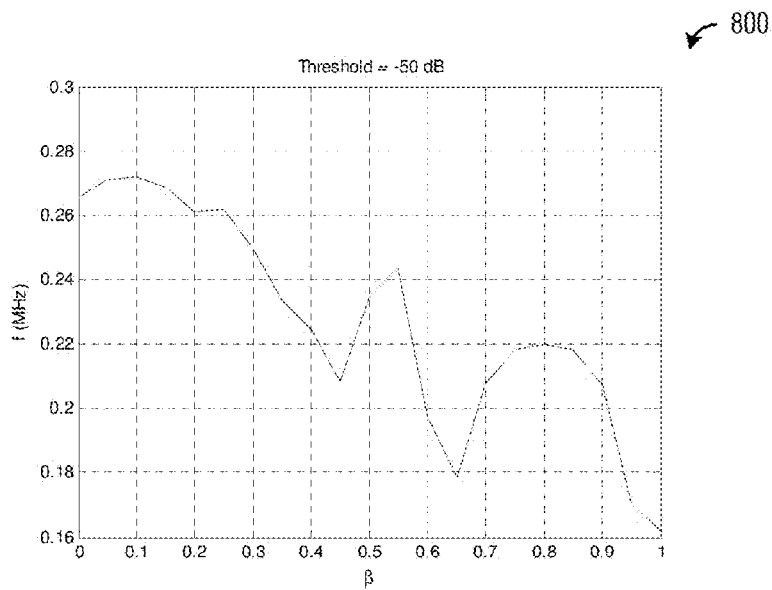
FIGS. 8a and 8b illustrate data plots of frequency when example truncated filters meet a signal rejection threshold for different roll-off factors according to example embodiments described herein.
Figure 8B:
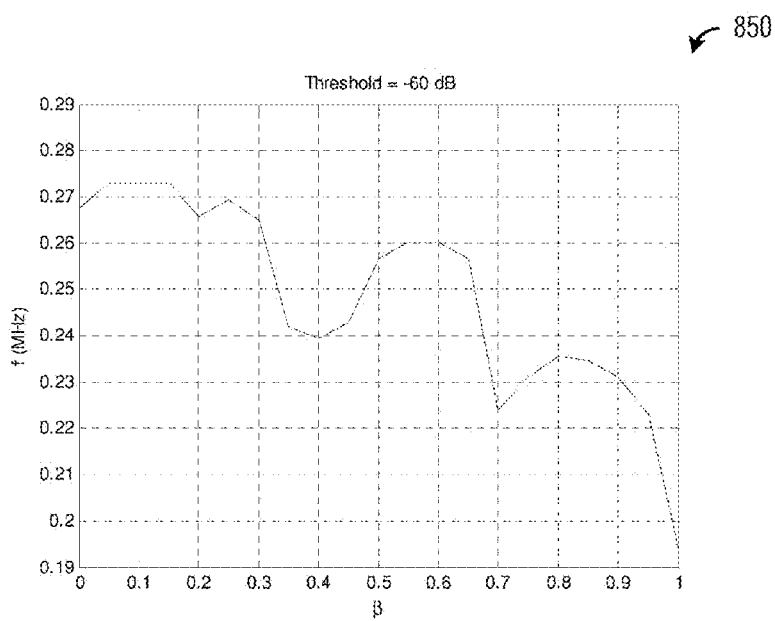

FIGS. 8a and 8b illustrate data plots 800 and 850 of frequency when example truncated filters meet a signal rejection threshold for different roll-off factors. Data plot 800 corresponds to a signal rejection threshold of −50 dB and data plot 850 corresponds to a signal rejection threshold of −60 dB. The data plots show that the frequency at which the truncated filters meet the signal rejection threshold generally decreases with increased roll-off parameter.

Figure 9:
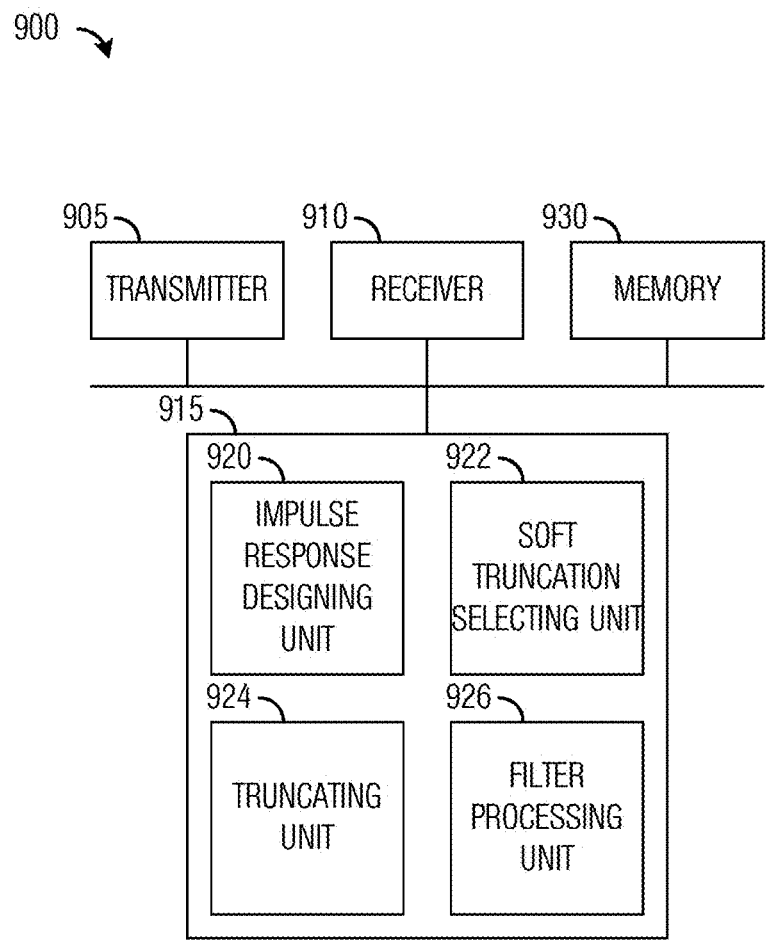
FIG. 9 illustrates an example device according to example embodiments described herein.

FIG. 9 illustrates an example device 900. Device 900 may be an implementation of a designing device, a transmitting device, and the like. Device 900 may be used to implement various ones of the embodiments discussed herein. As shown in FIG. 9, a transmitter 905 is configured to transmit packets, and the like. Communications device 900 also includes a receiver 910 that is configured to receive packets, and the like.

An impulse response designing unit 920 is configured to design an impulse response for a prototype filter too meet spectral requirements, such as pass band width, pass band ripple, transition duration, and the like. As an example, impulse response designing unit 920 selects an impulse response that follows a sinc function that meets the spectral requirements. A soft truncation selecting unit 922 is configured to select a soft truncation function, such as a raised cosine, a ramp, and the like, as well as a roll-off parameter. A truncating unit 924 is configured to truncate the prototype filter with the soft truncation function to produce a truncated filter. Coefficients of the truncated filter may be saved. A filter processing unit 926 is configured to save the truncated filter. Filter processing unit 926 is configured to retrieve a saved truncated filter. Filter processing unit 926 is configured to filter a signal with the truncated filter. A memory 930 is configured to store prototype filters, soft truncation functions, roll-off factors, truncated filters, signals to be filtered, filtered signals, and the like.

The elements of device 900 may be implemented as specific hardware logic blocks. In an alternative, the elements of device 900 may be implemented as software executing in a processor, controller, application specific integrated circuit, or so on. In yet another alternative, the elements of device 900 may be implemented as a combination of software and/or hardware.

As an example, receiver 910 and transmitter 905 may be implemented as a specific hardware block, while impulse response designing unit 920, soft truncation selecting unit 922, truncating unit 924, and filter processing unit 926 may be software modules executing in a microprocessor (such as processor 915) or a custom circuit or a custom compiled logic array of a field programmable logic array. Impulse response designing unit 920, soft truncation selecting unit 922, truncating unit 924, and filter processing unit 926 may be modules stored in memory 930.

Although the present disclosure and its advantages have been described in detail, it should be understood that various changes, substitutions and alterations can be made herein without departing from the spirit and scope of the disclosure as defined by the appended claims.

What is claimed is:

1. A method for transmitting data, the method comprising:
    designing, by a wireless transmitting device, a first filter truncated by a first soft truncation function with a first roll-off parameter specifying a first rate at which the first soft truncation function transitions to zero;
    designing, by the wireless transmitting device, a second filter truncated by a second soft truncation function with a second roll-off parameter specifying a second rate at which the second soft truncation function transitions to zero;
    filtering, by the wireless transmitting device, a first data signal with the first filter;
    filtering, by the wireless transmitting device, a second data signal with the second filter;
    wirelessly transmitting, by the wireless transmitting device, the filtered first data signal; and
    wirelessly transmitting, by the wireless transmitting device, the filtered second data signal.

2. The method of claim 1, wherein the first soft truncation function comprises a raised cosine function expressible as $$f_w(t) = \begin{cases} 1, & |t| \leq \frac{1-\beta}{2f_0} \\ \frac{1}{2}\left[1 + \cos\left(\frac{\pi f_0}{\beta}\left[|t| - \frac{1-\beta}{2f_0}\right]\right)\right], & \frac{1-\beta}{2f_0} < |t| \leq \frac{1+\beta}{2f_0}, \\ 0, & o.w. \end{cases}$$

where $f_0 \triangleq (1+\beta)/T_w$, t is time, $T_w$, is a time duration of the first soft truncation function, and $\beta$ is the first roll-off parameter.

3. The method of claim 1, wherein the first data signal comprises an orthogonal frequency division multiplexing (OFDM) signal.

4. The method of claim 1, wherein the filtered first data signal and the filtered second data signal are transmitted simultaneously in different frequency bands.

5. The method of claim 1, wherein the first soft truncation function comprises one of a ramp function, a curve function, an elliptical function, an exponential function, a Blackman window, a Kaiser window, or a Chebyshev window.

6. The method of claim 1, wherein the first soft truncation function comprises a function with a gradual transition to zero.

7. The method of claim 1, further comprising storing the first filter in a memory of the wireless transmitting device.

8. The method of claim 1, wherein designing the first filter comprises:
designing a prototype filter with a target frequency response; and
applying the first soft truncation function to the prototype filter to generate the first filter.

9. The method of claim 8, wherein applying the first soft truncation function to the prototype filter comprises multiplying the first soft truncation function and the prototype filter.

10. The method of claim 8, further comprising selecting the first roll-off parameter in accordance with the target frequency response.

11. The method of claim 8, wherein the prototype filter comprises a sync filter.

12. A wireless transmitting device comprising:
a processor of the wireless transmitting device configured to
design a first filter truncated by a first soft truncation function with a first roll-off parameter specifying a first rate at which the first soft truncation function transitions to zero,
design a second filter truncated by a second soft truncation function with a second roll-off parameter specifying a second rate at which the second soft truncation function transitions to zero,
filter a first data signal with the first filter, and
filter a second data signal with the second filter; and
a wireless transmitter operatively coupled to the processor, the wireless transmitter configured to wirelessly transmit the filtered first data signal and wirelessly transmit the filtered second data signal.

13. The wireless transmitting device of claim 12, wherein the first data signal comprises an orthogonal frequency division multiplexing (OFDM) signal.

14. The wireless transmitting device of claim 12, wherein the filtered first data signal and the filtered second data signal are transmitted simultaneously in different frequency bands.

15. The wireless transmitting device of claim 12, wherein the first soft truncation function comprises a raised cosine function expressible as $$f_w(t) = \begin{cases} 1, & |t| \leq \frac{1-\beta}{2f_0} \\ \frac{1}{2}\left[1 + \cos\left(\frac{\pi f_0}{\beta}\left[|t| - \frac{1-\beta}{2f_0}\right]\right)\right], & \frac{1-\beta}{2f_0} < |t| \leq \frac{1+\beta}{2f_0}, \\ 0, & o.w. \end{cases}$$

where $f_0 \triangleq (1+\beta)/T_w$, t is time, $T_w$, is a time duration of the first soft truncation function, and $\beta$ is the first roll-off parameter.

16. The wireless transmitting device of claim 12, wherein the first soft truncation function comprises one of a ramp function, a curve function, an elliptical function, an exponential function, a Blackman window, a Kaiser window, or a Chebyshev window.

17. The wireless transmitting device of claim 12, wherein the first soft truncation function comprises a function with a gradual transition to zero.

18. The wireless transmitting device of claim 12, further comprising a non-transitory memory operatively coupled to the processor, wherein the processor is configured to store the first filter in the non-transitory memory.

19. The wireless transmitting device of claim 12, wherein the processor configured to design the first filter comprises the processor configured to:
design a prototype filter with a target frequency response; and
apply the first soft truncation function to the prototype filter to generate the first filter.

20. The wireless transmitting device of claim 19, wherein the processor configured to apply the first soft truncation function to the prototype filter comprises the processor configured to multiply the first soft truncation function and the prototype filter.

21. The wireless transmitting device of claim 19, wherein the processor is configured to select the first roll-off parameter in accordance with the target frequency response.

22. The wireless transmitting device of claim 19, wherein the prototype filter comprises a sync filter.

* * * * *

UNITED STATES PATENT AND TRADEMARK OFFICE
CERTIFICATE OF CORRECTION

PATENT NO. : 9,614,499 B2
APPLICATION NO. : 14/222280
DATED : April 4, 2017
INVENTOR(S) : Abdoli It is certified that error appears in the above-identified patent and that said Letters Patent is hereby corrected as shown below:

In the Claims

In Column 9, Line 1, Claim 2, delete "where $f_0 \triangleq (1 + \beta)/T_w$, t is time, $T_w$, is a time duration of the" and insert --where $f_0 \triangleq (1 + \beta)/T_w$, t is time, $T_w$ is a time duration of the--.

In Column 10, Line 18, Claim 15, delete "where $f_0 \triangleq (1 + \beta)/T_w$, t is time, $T_w$, is a time duration of the" and insert --where $f_0 \triangleq (1 + \beta)/T_w$, t is time, $T_w$ is a time duration of the--.

Signed and Sealed this
Eighteenth Day of September, 2018

Andrei Iancu
*Director of the United States Patent and Trademark Office*